(12) United States Patent
Okayasu et al.

(10) Patent No.: US 6,462,598 B1
(45) Date of Patent: Oct. 8, 2002

(54) DELAY TIME CONTROL CIRCUIT

(75) Inventors: Toshiyuki Okayasu; Takashi Sekino, both of Saitama (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 09/254,894

(22) PCT Filed: Oct. 28, 1996

(86) PCT No.: PCT/US96/17197

§ 371 (c)(1),
(2), (4) Date: Jun. 8, 2001

(87) PCT Pub. No.: WO98/19395

PCT Pub. Date: May 7, 1998

(51) Int. Cl.[7] .............................................. H03H 11/26

(52) U.S. Cl. ........................................ 327/276; 327/161

(58) Field of Search ............................... 327/149, 158, 327/161, 276, 277, 278, 286, 284, 285

(56) References Cited

U.S. PATENT DOCUMENTS 5,869,992 A  *  2/1999  Sekino .................... 327/276

* cited by examiner

*Primary Examiner*—Terry D. Cunningham
*Assistant Examiner*—Quan Tra
(74) *Attorney, Agent, or Firm*—Muramatsu & Associates

(57) ABSTRACT

A delay time control circuit controls delay times without a significant increase of power consumption or circuit components. The delay time control circuit for controlling delay times in a logic circuit includes a delay circuit having a plurality of serially connected gates which forms a ring oscillator by connecting a last gate to a first gate to create a closed loop, a pulse generator for generating a fixed pulse width signal every time when receiving an oscillation signal from the ring oscillator, an integrator which integrates an output signal of the pulse generator to produce an average voltage indicating a duty cycle of the output signal, and a delay time control voltage generator which compares the average voltage and a reference voltage indicating a delay time for the logic circuit and generates a voltage which is applied to the logic circuit.

10 Claims, 8 Drawing Sheets

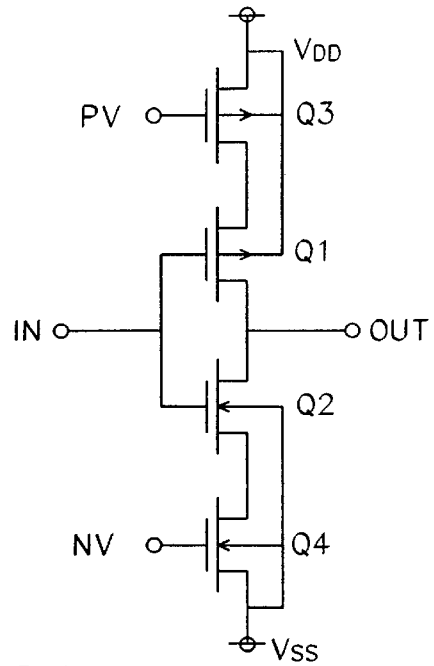
FIG. 2A
FIG. 2B₁
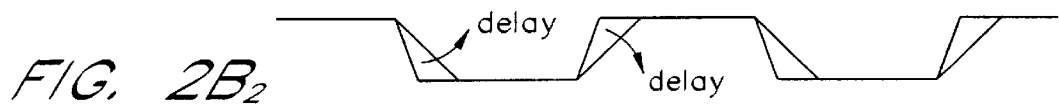
FIG. 2B₂

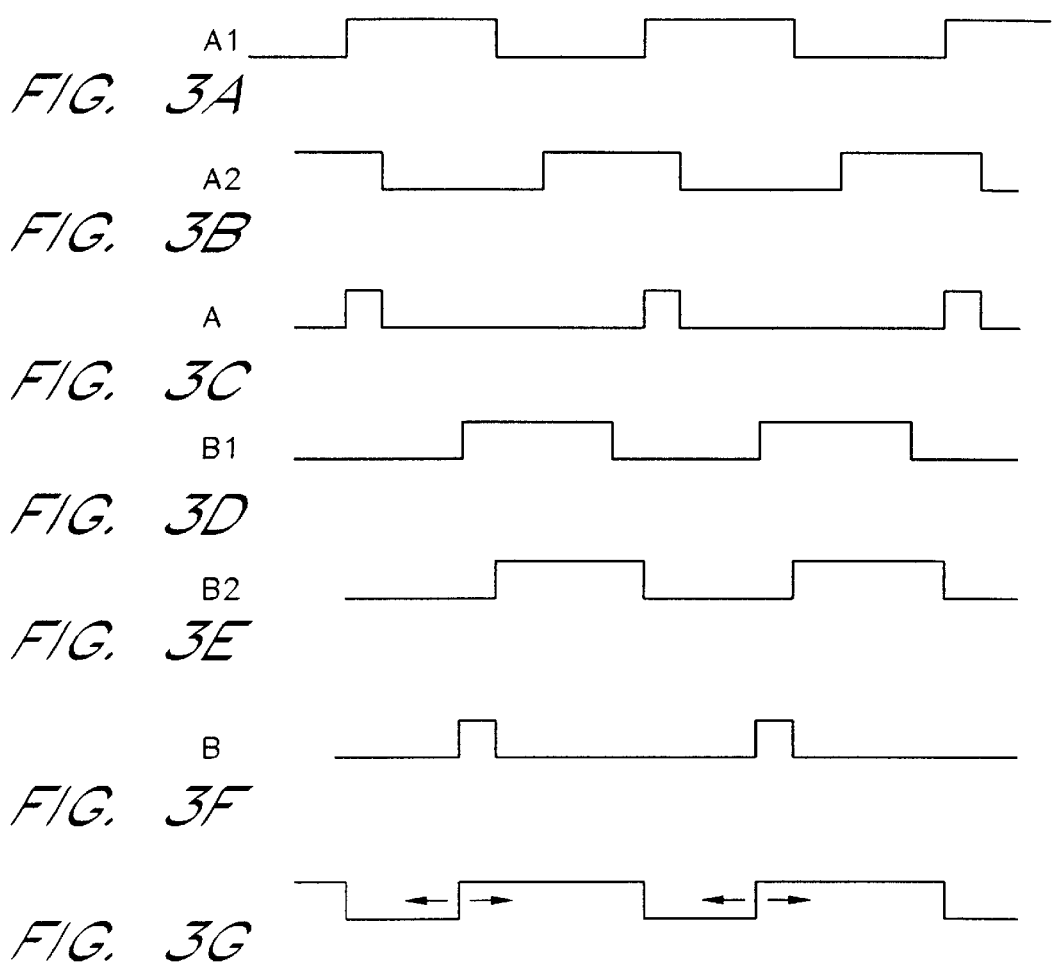

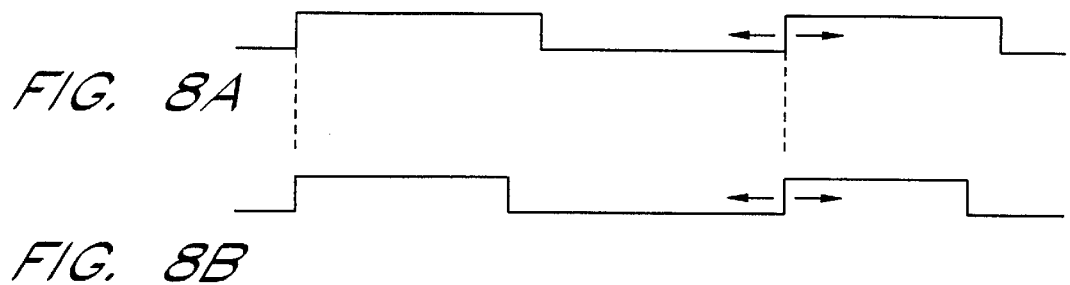

DELAY TIME CONTROL CIRCUIT

FIELD OF THE INVENTION

This invention relates to a delay time control circuit to be used in a semiconductor test system, and more particularly, to a delay time control circuit for controlling a signal propagation delay time of semiconductor gate circuits to generate test signals having accurate delay times for a semiconductor test system.

BACKGROUND OF THE INVENTION

In testing a semiconductor device by a semiconductor test system, a semiconductor device under test is provided with various test signals with varying timings. The semiconductor test system must generate the test signals while accurately controlling timings of the test signals. Typically, such timing differences are produced by delay circuits formed of CMOS circuits.

Such a delay circuit formed of semiconductor circuits usually includes a series of CMOS gates, typically inverters, each of which has a certain propagation delay time. A delay time is determined by selecting the number of inverters serially connected in the delay circuit. However, the transmission delay times in the CMOS circuits are subject to surrounding temperature changes and/or voltage changes, which decrease the accuracy of the delay times in the semiconductor test system. Therefore, to maintain the high accuracy or to stabilize the delay times in the semiconductor test system, the following methods or technologies are used in the conventional delay circuits having the semiconductor gates, typically CMOS gates, as delay elements.

In one conventional method, a heater is provided in an LSI (large scale integrated) circuit having CMOS gate delay circuits. The heater is positioned close to the CMOS gate delay circuits in the LSI. A delay time detector is also provided in the LSI circuit or in the close proximity of the LSI circuit to detect the delay time changes in the CMOS gate delay circuits. Since the delay times in the CMOS gates vary with the changes of the surrounding temperature, the heater is controlled so as to maintain the delay times of the CMOS gates constant based on the delay time changes detected by the delay time detector.

However, in this conventional method, an overall power consumption in the LSI circuit increases since the additional power is consumed to raise the internal temperature of the LSI circuit. Namely, to maintain the constant delay time, electric currents must be provided to the heater so as to control the internal temperature and thus the delay times in the CMOS delay circuit. Thus, it is not possible to decrease the power consumption in the LSI circuit. Further, additional circuit components are inevitable such as semiconductor cells to be used as the heater and the delay time detector.

In the other conventional method, an overall number of pulses or total frequencies in the delay circuit is controlled to be a constant value. Since the heat generation by the CMOS gates is proportional to the number of pulses or the overall frequency provided to the CMOS gates, i.e., the number of changes in the state (high or low) in the CMOS gates, it has been attempted to maintain the temperature of the CMOS gate delay circuit constant by controlling the overall number of pulses in the delay circuit constant.

For so doing, a dummy circuit formed of CMOS gates is provided in the LSI circuit to receive a certain number of pulses to supplement the pulses which is short in the actual CMOS delay circuit to make the overall number of pulses to be equal to the predetermined value. For example, in case where the predetermined overall number of pulses in one second is 20,000,000 and the actual number of pulses provided to the CMOS gate delay circuit is 2,000,000 to form a specific test signal, 8,000,000 pulses are generated to be provided to the dummy CMOS circuit.

However, in this conventional method, as in the first example, the overall power consumption in the LSI circuit increases since the additional power is consumed in the dummy CMOS circuit by the action of the supplemental number of pulses to make the overall number of pulses in the LSI circuit constant. Namely, to maintain the constant delay time, additional pulses must be provided to the dummy circuit so as to maintain the overall number of pulses constant. This is because to control the overall number of pulses to maintain the constant value is to control the internal temperature constant and also the delay times in the CMOS delay circuit constant.

Thus, in this example, it is not possible to decrease the power consumption in the LSI circuit since the additional power consumption is always necessary to stabilize the delay times. Further, in addition to the dummy CMOS circuit as mentioned above, further additional circuit components are necessary such as a circuit for detecting the number of pulses provided to the CMOS delay circuit and a circuit which generates the supplemental number of pulses for the dummy circuit.

In the further conventional method, source voltages to the CMOS gates delay circuit are controlled to stabilize the delay time of the delay circuit. As noted above, the delay times in the CMOS gates vary depending on the source voltages supplied to the CMOS gates. Thus, in this method, the delay times in the CMOS gates are monitored and a control voltage is feedbacked to adjust the source voltages to the CMOS gates to control the delay times constant.

In this method, however, as in the above two examples, the power consumption in the semiconductor test system increases. This is because the process of controlling the voltage sources must involve voltage drops in source voltage generating circuits connected to the CMOS gates. Thus the source voltage level for this method must be larger than an ordinary source voltage level to secure a certain control voltage range.

Furthermore, in this method of controlling the source voltages to the CMOS gates, since the change in the delay time in response to the change of the source voltage is small, an additional control means is usually necessary to compensate the delay time variance between each CMOS gates. For example, to maintain the delay time of the CMOS gates constant, output capacitance of some of the CMOS gates must also be controlled in addition to the control of the source voltages. Therefore, the number of circuit components or an overall circuit size increases in this example.

Moreover, in all of the above three conventional examples, although the delay times can be controlled to be a constant value, it is not possible to control a very small amount of delay time for each CMOS gate.

SUMMARY OF THE INVENTION

It is, therefore, an object of the present invention to provide a delay time control circuit for a semiconductor test system which is capable of controlling the delay time of a semiconductor gate delay circuit with high accuracy and stability without involving a large increase of power consumption in the overall delay circuit.

It is another object of the present invention to provide a delay time control circuit for a semiconductor test system which is capable of controlling the delay time of a semiconductor gate delay circuit with high accuracy and stability with a minor increase in circuit components.

It is a further object of the present invention to provide a delay time control circuit for a semiconductor test system which is capable of controlling the delay time of a semiconductor gate delay circuit with high accuracy and stability by controlling positive and negative gate control voltages of each semiconductor gate so that the delay time can be adjusted with high resolution.

In order to achieve the above objective, in the delay time control circuit of the present invention, the delay time change is monitored as a change of a duty ratio which is converted to a DC voltage. The DC voltage is compared with a reference voltage, and the difference between the two voltages is used to control a gate voltage for each CMOS gate.

Namely, the delay time control circuit of the present invention, for controlling delay times of a logic circuit which determines timings of test signals in a semiconductor test system, includes: a delay circuit having a plurality of serially connected semiconductor gates which are the same type of semiconductor gates as in the logic circuit; a pulse signal supplied to the delay circuit; a first group of gates which is a set of semiconductor gates in an input side of the semiconductor gates wherein the first group of gates generates a reset pulse based on the pulse signal; a second group of gates which is a set of semiconductor gates in an output side of the semiconductor gates wherein the second group of gates generates a set pulse based on the pulse signal; a delay-duty converter which is set by the set pulse from the second group of gates and is reset by the reset pulse by the first group of gates; an integrator which integrates an output signal of the delay-duty converter to produce an average voltage indicating a duty cycle of the output signal of the flip-flop; a first delay time control voltage generator which compares the average voltage from the integrator and a reference voltage indicating a delay time for the logic circuit and generates a first control voltage which is applied to the logic circuit and the delay circuit; and a second delay time control voltage generator which receives the first control voltage from the first delay time control voltage generator and generates a second control voltage which is symmetrical to the first control voltage and is applied to the logic circuit and the delay circuit.

In another aspect of the present invention, a delay time control circuit for controlling delay times of a logic circuit which determines timings of test signals in a semiconductor test system is comprised of: a delay circuit having a plurality of series connected semiconductor gates; a pulse generator for providing a pulse signal to the delay circuit; a delay-duty converter which is driven by an input pulse signal of the delay circuit and an output pulse signal of the delay circuit; an integrator which integrates an output signal of the delay-duty converter to produce an average voltage indicating a duty cycle of the output signal of the delay-duty converter; and a delay time control voltage generator which compares the average voltage from the integrator and a reference voltage indicating a delay time for the logic circuit and generates a control voltage which is applied to the logic circuit and the delay circuit.

In the further aspect of the present invention, a delay time control circuit for controlling delay times of a logic circuit which determines timings of test signals in a semiconductor test system is comprised of: a delay circuit having a plurality of series connected semiconductor gates which forms a ring oscillator by connecting an output of the last semiconductor gate of the delay circuit to an input of a first semiconductor gate to form a closed loop; a pulse generator for generating a fixed pulse width signal every time when receiving an oscillation signal from the ring oscillator; an integrator which integrates an output signal of the pulse generator to produce an average voltage indicating a duty cycle of an output of the pulse generator; and a delay time control voltage generator which compares the average voltage from the integrator and a reference voltage indicating a delay time for the logic circuit and generates a control voltage which is applied to the logic circuit and the delay circuit.

According to the present invention, the delay time control circuit for the semiconductor test system can control the delay time of the semiconductor gate delay circuit with high accuracy and stability without involving a large increase of power consumption in the delay circuit.

Further, in the present invention, the delay time control circuit can control the delay time of the semiconductor gate delay circuit with high accuracy and stability with only a minor increase in the circuit components. Furthermore, the delay time control circuit of the present invention can control the delay time of the semiconductor gate delay circuit with high resolution by controlling positive and negative gate control voltages of each semiconductor gate.

BRIEF DESCRIPTION OF THE DRAWINGS

FIG. 2A is a circuit diagram showing a basic configuration of a CMOS inverter circuit, and FIGS. $2B_1$, and $2B_2$ are timing charts of the CMOS inverter circuit of FIG. 2A.

FIGS. 3A–3G are timing charts showing an operation of the delay time control circuit of the present invention shown in FIG. 1.

FIGS. 8A and 8B are timing charts showing an operation of the delay time control circuit in the third embodiment of the present invention shown in FIG. 7.

DETAILED DESCRIPTION OF THE PREFERRED EMBODIMENT

Figure 1:
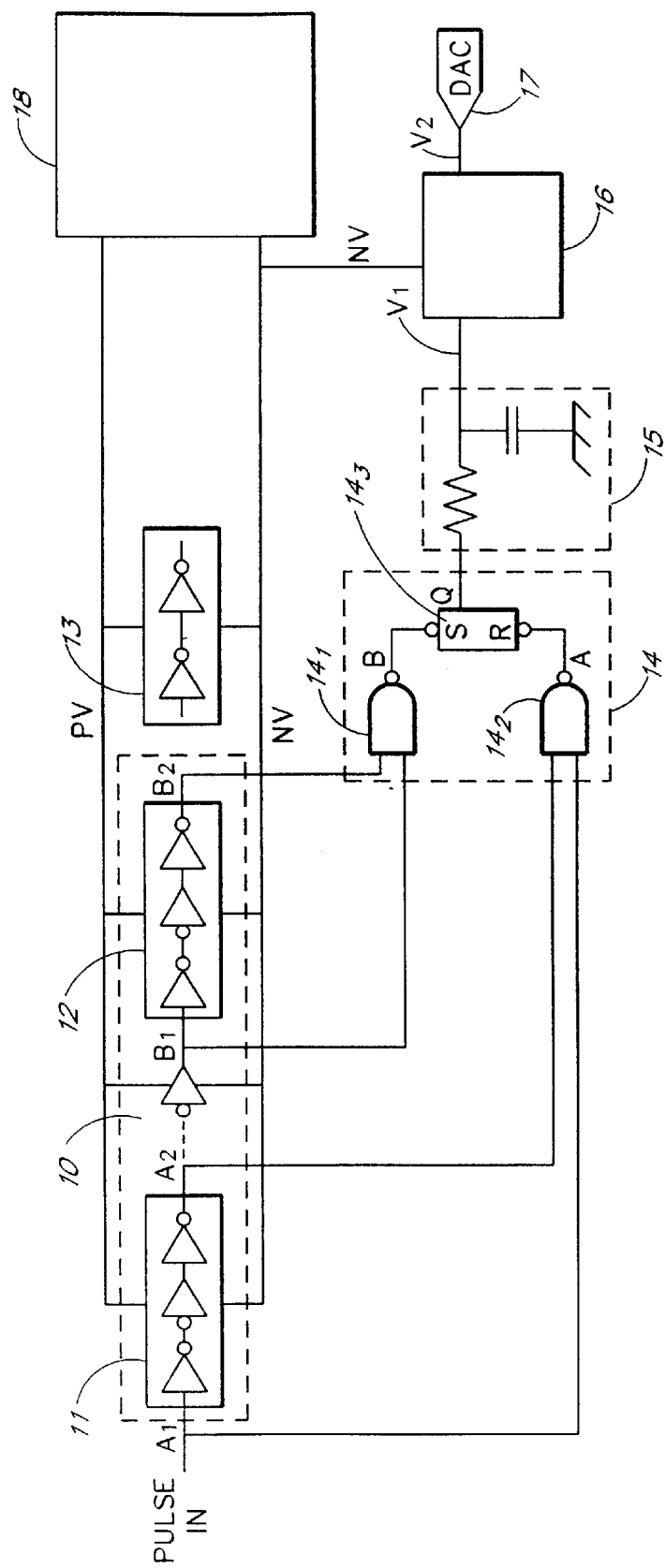
FIG. 1 is a block diagram showing a circuit configuration of the delay time control circuit of the present invention.

FIG. 1 shows a circuit diagram of the delay time control circuit of the present invention. The delay time control circuit includes a series delay circuit 10 formed of semiconductor gates such as CMOS gates, a delay time to duty cycle (delay-duty) converter 14, an integrator 15, a delay time control voltage generator 16, a digital-analog converter 17 and a threshold voltage control circuit 18. A logic circuit 13 is a delay time circuit formed of semiconductor gates, typically CMOS gates, for a semiconductor test system. Preferably, all of the components in FIG. 1 are made in one semiconductor integrated circuit.

The semiconductor gates in the series delay circuit 10 and the logic circuit 13 are formed in the same LSI circuit through the same production process. Typically, the logic circuit 13 includes several tens of CMOS gates, such as inverters, for each test channel of the semiconductor test system, to selectively provide delay times to test signals propagating therethrough. The test signals are then wave-formatted and applied to the IC device under test. Thus, the delay time control circuit of the present invention is to control and stabilize the delay times of the logic circuit 13 for generating test signals which are accurately timing controlled signals for testing the semiconductor devices.

As shown in FIG. 1, a delay circuit 11 formed of a first group of several gates of the series delay circuit 10 is used to generate a reset pulse for the delay-duty converter 14. A delay circuit 12 formed of a last group of several gates of the series delay circuit 10 is used to generate a set pulse for the delay-duty converter 14. For example, between the points A1 and A2 of FIG. 1, the first three gates are used to generate the reset pulse, while between the points B1 and B2, the last three gates are used to generate the set pulse for the delay-duty converter 14.

A pulse signal is provided at the point A1 which propagates through the series delay circuit 10 to the point B2. The set pulse is formed by the rising edge at the point B1 and the rising edge at the point B2 when these edges are receive by a NAND gate 14, in the delay-duty converter 14. The reset pulse is formed by the rising edge at the point A1 and the rising edge at the point A2 when these edges are receive by a NAND gate $14_2$ in the delay-duty converter 14. The set pulse is given to the set terminal of an RS flip-flop $14_3$ and the reset pulse is given to the reset terminal of the RS flop-flop $14_3$.

A duty cycle of output pulses of the delay-duty converter 14, i.e., the RS flip-flop $14_3$, represents a delay time between the point A1 and the point B1 of the series delay circuit 10. Namely, the delay time in the series delay circuit 10 is converted to the duty cycle in the output of the delay-duty converter 14. The output pulses of the delay-duty converter 14 are integrated (averaged) by the integrator 15 so that a DC voltage V1 at the output of the integrator 15 represents the duty cycle of the output pulses of the delay-duty converter 14.

The integrated voltage V1 is supplied to the delay time control voltage generator 16 wherein it is compared with a reference voltage V2 from the digital-analog converter 17. The reference voltage V2 is set, prior to the semiconductor testing, to determine the delay times of the test signals. The delay time control voltage generator 16 produces a negative control voltage NV based on the voltage difference between the integrated voltage V1 and the reference voltage V2.

The negative control voltage NV is supplied to the series delay circuit 10 and the logic circuit 13. The negative control voltage NV is also provided to the threshold voltage control circuit 18. The threshold voltage control circuit 18 generates a positive control voltage PV based on the negative control voltage NV. Thus, the function of the threshold voltage generator 18 is basically the same as the delay time control voltage generator 16. The positive control voltage PV is supplied to the series delay circuit 10 and the logic circuit 13. The negative and positive control voltages change the delay times in the series delay circuit 10 and the logic circuit 13. Thus, by controlling the reference voltage at the output of the digital-analog converter 17, the delay time in the logic circuit 13, which is a delay time circuit for the semiconductor test system, is controlled.

FIG. 2A is a circuit diagram showing a basic configuration of a CMOS inverter circuit, and FIGS. $2B_1$ and $2B_2$ are timing charts of the CMOS circuit of FIG. 2A. A plurality of inverters, each of which is configured as shown in FIG. 2A, are connected in series in the series delay circuit 10 and the logic circuit 13. The CMOS inverter is formed of four MOS transistors Q1–Q4. The transistors Q1 and Q3 are connected in series in the positive side and is provided with a positive voltage source $V_{DD}$. The transistors Q2 and Q4 are connected in series in the negative side and is provided with a negative voltage source $V_{SS}$.

An input pulse is applied to the gates of the MOS transistors Q1 and Q2 and an output pulse is taken from the sources of the MOS transistors Q1 and Q2. The positive control voltage PV is provided to the gate of the transistor Q3 while the negative control voltage NV is provided to the gate of the transistor Q4. As noted above, the positive control voltage PV and the negative control voltage NV are controlled by the reference voltage produced by the digital-analog converter 17.

In this arrangement, depending on the amount of either the negative control voltage NV or the positive control voltage PV, a resistance (source-drain resistance) in each of the transistor Q3 and Q4 is changed. By this change in the resistance, in combination with an output capacitance, typically a stray capacitance (not shown), a rise time and a fall time of the output pulse vary, which accordingly changes a delay time of the output pulse.

For example, an input pulse at the gates of the MOS transistors Q1 and Q2 is shown in FIG. $2B_1$ and an output pulse at the sources of the transistors Q1 and Q2 is shown in FIG. $2B_2$. Because of the changes in the resistance in the MOS transistors Q3 and Q4, the time constants in the rising and falling edges of the output pulse vary which accordingly change the delay time of the output pulse as shown in FIG. $2B_2$.

FIGS. 3A–3G are timing charts showing an operation of the delay time control circuit of the present invention shown in FIG. 1. A pulse signal as shown in FIG. 3A is provided at the point A1 which propagates through the series delay circuit 10 to the point B2. At the point A2, in FIG. 3B, the pulse signal is delayed by the sum of delay times in the three stages of inverters. Thus, the reset pulse A whose pulse width is the sum of such delay times is produced as shown in FIG. 3C. Similarly, the pulse signal of FIG. 3A is delayed by the sum of inverters between the point A1 and the point B1 of the series delay circuit 10 as shown in FIG. 3D. The pulse signal is further delayed by the delay times of three inverters at the point B2 as shown in FIG. 3E. Thus, the set pulse B is produced as shown in FIG. 3F. By the set and reset pulses, the RS flip-flop $14_3$ of FIG. 1 changes its state as shown in FIG. 3G. Since the set pulse reflects the delay time of the series of inverters between the points A1 and B1 of the series delay circuit 10, the information of the delay time is converted to the duty cycle of the output pulse of the RS flip-flop $14_3$.

As noted above with reference to FIG. 1, the output pulse of the delay-duty converter 14 is integrated (averaged) by the integrator 15, and the integrated voltage V1 is supplied to the delay time control voltage generator 16 wherein it is compared with a reference voltage V2 from the digital-analog converter 17. The delay time control voltage generator 16 produces the negative control voltage NV based on the voltage difference between the integrated voltage V1 and the reference voltage V2. The threshold voltage control circuit 18 generates a positive control voltage PV based on the negative control voltage NV.

The positive control voltage PV is supplied to the series delay circuit 10 and the logic circuit 13. The negative and positive control voltages change the resistance value of each of the inverters in the series delay circuit 10 and the logic circuit 13. Thus, by controlling the reference voltage at the output of the digital-analog converter 17, the delay time in the logic circuit, which is a delay time circuit for the semiconductor test system, is controlled, as described in the foregoing.

Figure 4:
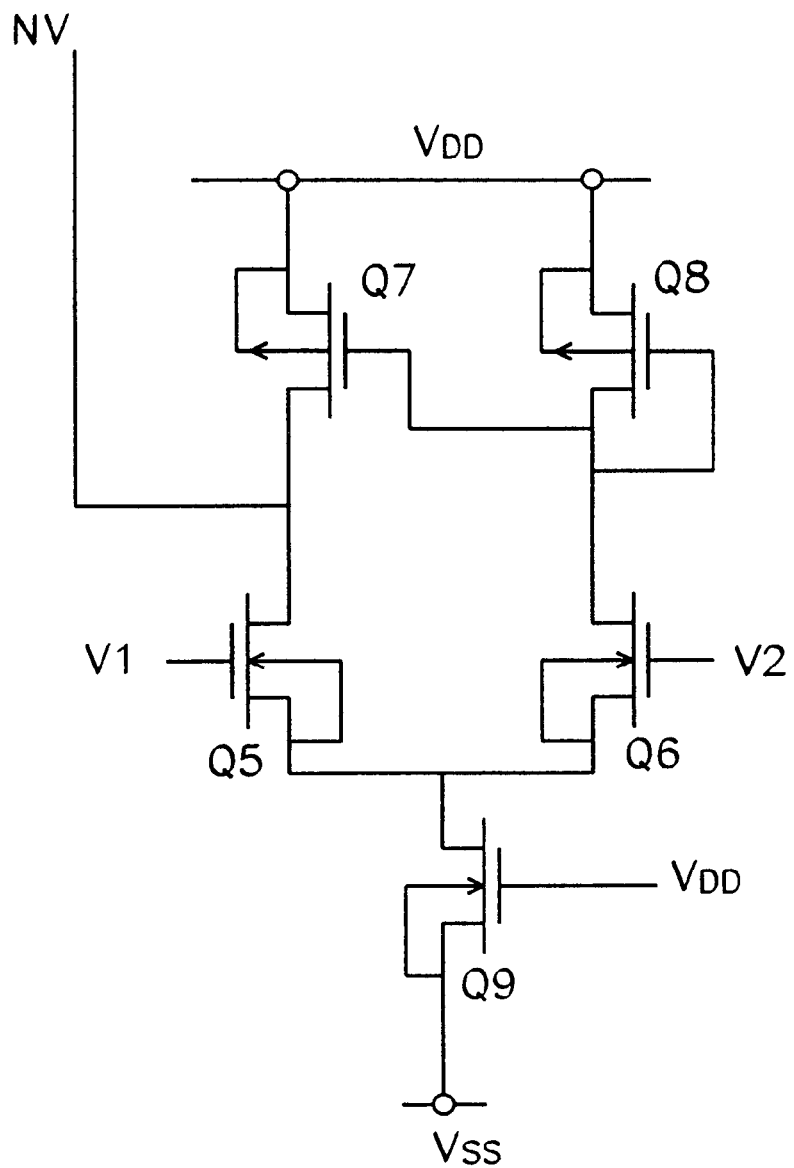
FIG. 4 is a circuit diagram showing a circuit configuration of a delay time control voltage generator to be used in the delay time control circuit of FIG. 1.

FIG. 4 is a circuit diagram showing an example of circuit configuration of the delay time control voltage generator 16 in the delay time control circuit of FIG. 1.

As noted above with reference to FIGS. 1 and 3, the delay time control voltage generator 16 compares the averaged voltage V1 and the reference voltage V2 and generates a negative control voltage NV which is proportional to the voltage difference between the voltages V1 and V2. Thus, the delay time control voltage generator 16 is basically a differential amplifier having two symmetrical input terminals of common ground.

In the example of FIG. 4, the delay time control voltage generator 16 is formed of MOS transistors Q5–Q9 in which Q5 and Q6 are input transistors. The gate of the transistor Q5 receives the integrated voltage V1 while the gate of the transistor Q6 receives the reference voltage V2. The transistor Q9 is connected to the sources of the transistors Q5 and Q6 and functions as a current source for the transistors Q5 and Q6. The transistors Q7 and Q8 are used as resisters for the transistors Q5 and Q6, respectively. The negative control voltage NV is taken from the drain of the transistor Q5. The negative control voltage NV is proportional to the voltage difference between the input voltages V1 and V2.

Figure 5:
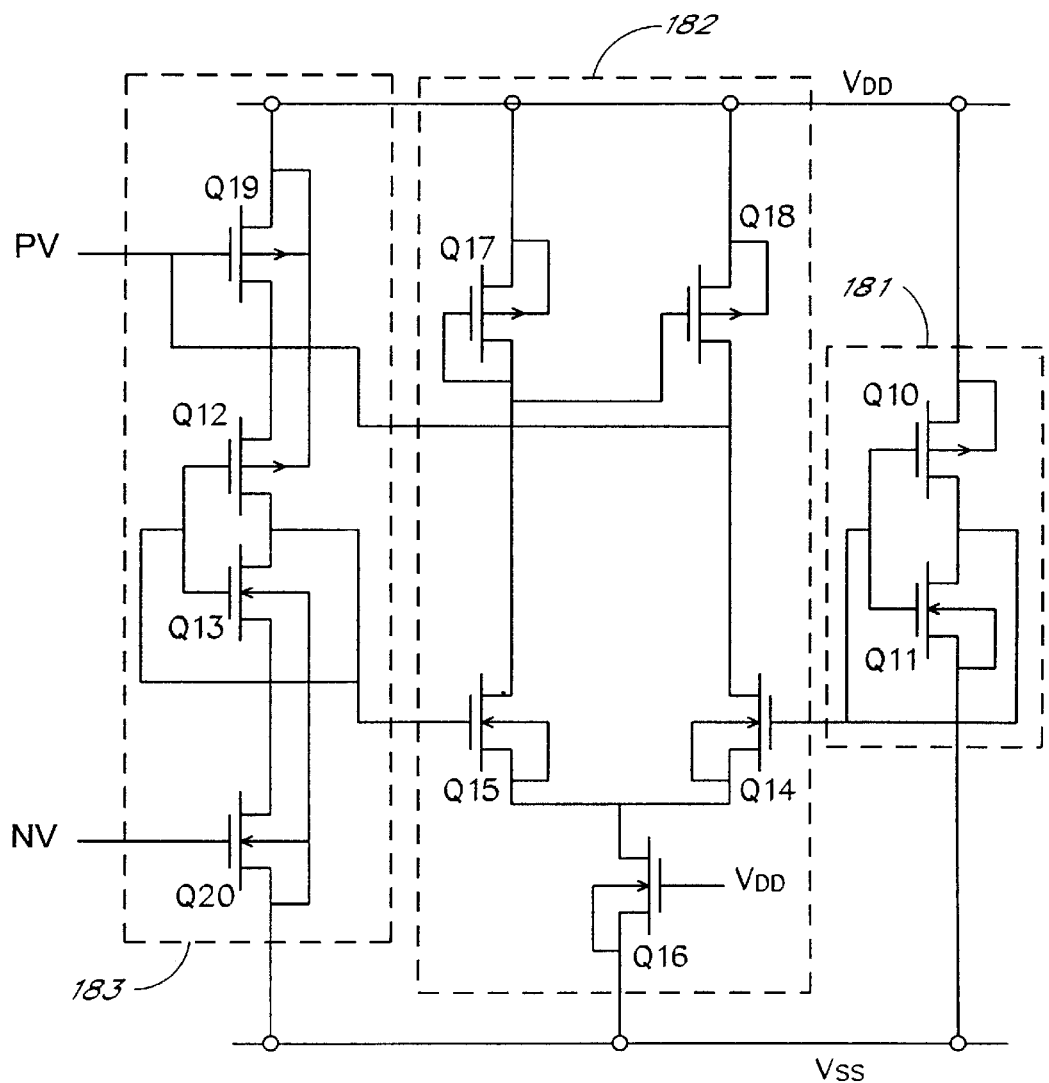
FIG. 5 is a circuit. diagram showing a circuit configuration of a threshold voltage control circuit to be used in the delay time control circuit of FIG. 1.

The negative control voltage NV thus produced is provided to the logic circuit 13 and the series delay circuit 10 as shown in FIG. 1. At the same time, the threshold voltage control circuit 18 receives the negative control voltage NV to produce the positive control voltage PV. FIG. 5 is a circuit diagram showing an example of circuit configuration of the threshold voltage control circuit 18 in the delay time control circuit of the present invention in FIG. 1.

The threshold voltage control circuit 18 is formed of a reference voltage generator 181 having MOS transistors Q10 and Q11, a threshold voltage generator 183 having MOS transistors Q12, Q13, Q19 and Q20, and a positive control voltage generator 182 having MOS transistors Q14–Q18. The reference voltage generator 181 generates a reference voltage which is an intermediate voltage between the source voltages $V_{DD}$ and $V_{SS}$. The threshold voltage generator 183 generates an intermediate voltage between the negative control voltage NV and the positive control voltage PV.

Both intermediate voltages generated by the reference voltage generator 181 and the threshold voltage generator 183 are compared by the positive control voltage generator 182. As shown in FIG. 5, the positive control voltage generator 182 is a differential amplifier having a circuit configuration similar to the delay time control voltage generator 16 of FIG. 4. The transistors Q14 and Q15 receive the intermediate voltages from the reference voltage generator 181 and the threshold voltage generator 183, respectively.

The positive control voltage generator 182 generates the positive control voltage PV which is proportional to the difference between the two intermediate voltages provided to the transistors Q14 and Q15. The positive control voltage PV is supplied to the series delay circuit 10 and the logic circuit 13 of FIG. 1. As shown in FIG. 5, the positive control voltage PV is also supplied to the gate of the transistor Q19 and is used to produce the intermediate voltage of the voltages PV and NV when the negative control voltage NV is supplied to the gate of the transistor Q20. Thus, the positive control voltage PV is dependent on and symmetrical with the negative control voltage NV.

In the above example, the delay time control voltage generator 16 generates the negative control voltage NV and the threshold voltage control circuit 18 generates the positive control voltage PV. However, it is apparent that the other arrangement is also possible, for example, wherein the delay time control voltage generator 16 generates the positive control voltage PV while the threshold voltage control circuit 18 generates the negative control voltage NV.

Figure 6:
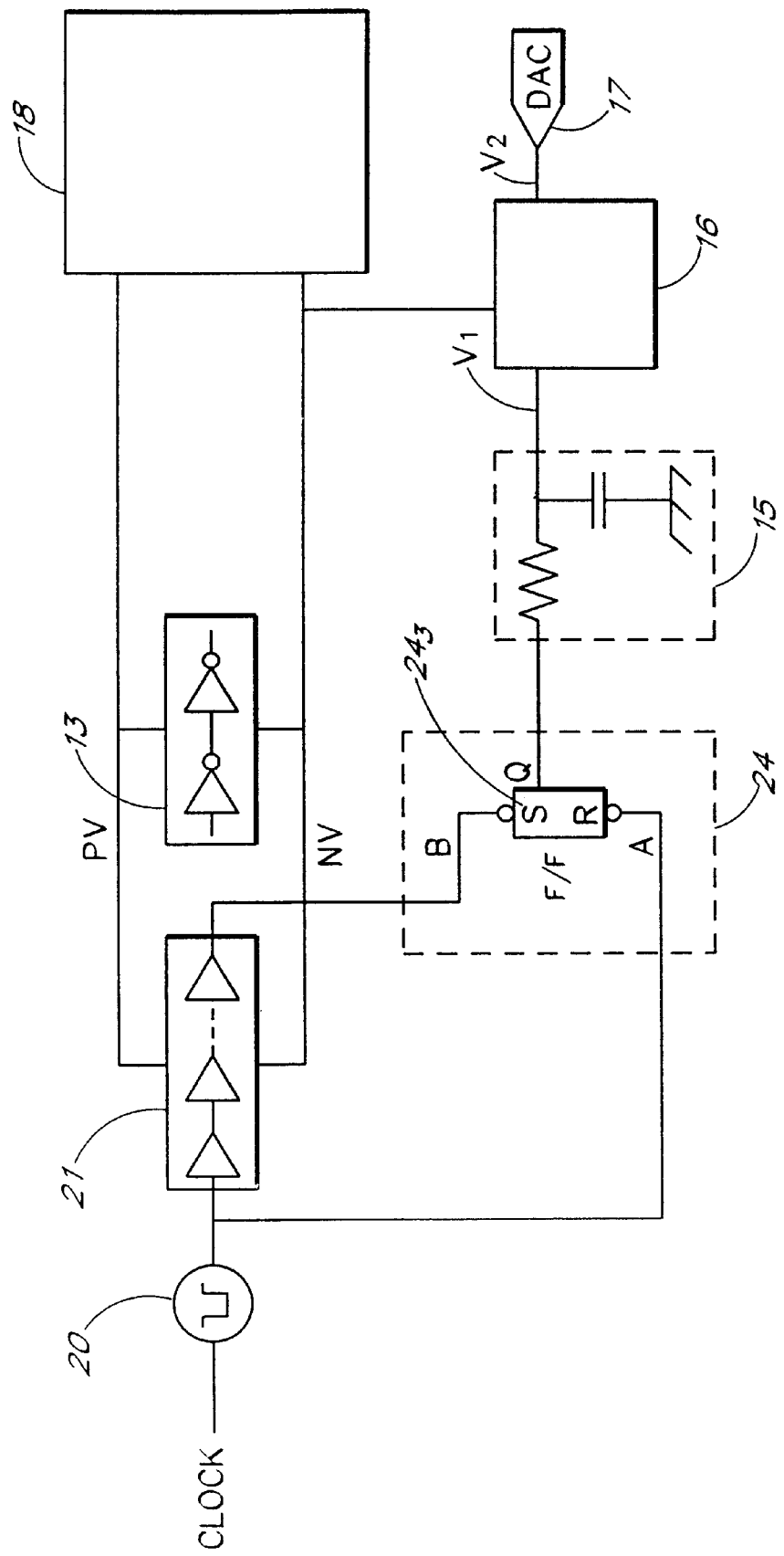
FIG. 6 is a block diagram showing a circuit configuration of the delay time control circuit in the second embodiment of the present invention.

FIG. 6 is a block diagram showing a second embodiment of the present invention. In this example, a clock signal is wave-shaped by a pulse generator 20 before being supplied to a delay circuit 21. As in the example of FIG. 1, the delay circuit 21 has a plurality of series connected gates which are the same kind of semiconductor circuit in the logic circuit 13 whose delay times are desired to be controlled and formed in the same integrated circuit. Further, as in the example of FIG. 1, the delay circuit 21 and the logic circuit 13 are provided with the same control voltages, a negative control voltage NV and a positive control voltage PV.

The output of the pulse generator 20 is also supplied to a delay time-to-duty converter (delay-duty converter) 24. The delay-duty converter 24 is, for example, an RS flip-flop $24_3$ having a set terminal and a reset terminal. The pulse signal at the input of the delay circuit 21 is also provided to the reset terminal of the RS flip-flop $24_3$. The pulse signal at the output of the delay circuit 21 is provided to the set terminal of the RS flip-flop $24_3$.

Therefore, after being reset by the pulse signal from the pulse generator 20, the RS flip-flop $24_3$ is set at the delay time determined by the delay circuit 21. In the next pulse, the RS flip-flop $24_3$ is reset, and after the delay time of the delay circuit 21, it is set again. This operation repeats for every clock pulse from the pulse generator 20. If the delay time in the delay circuit varies, the duty cycle of the output of the flip-flop $24_3$, i.e., the delay-duty converter 24 also varies. Namely, the delay time in the delay circuit 21 is converted to the duty cycle in the output of the delay-duty converter 24.

The output of the delay-duty converter 24 is integrated (averaged) by the integrator 15 so that a DC voltage V1 at the output of the integrator 15 represents the duty cycle of the output pulses of the delay-duty converter 24. The integrated voltage V1 is supplied to the delay time control voltage generator 16 wherein it is compared with a reference voltage V2 from the digital-analog converter 17.

The delay time control voltage generator 16 produces a negative control voltage NV based on the voltage difference between the integrated voltage V1 and the reference voltage V2. Based on the negative control voltage NV, a positive control voltage PV is produced by the threshold voltage control circuit 18. The negative and positive control voltages change the delay times in the delay circuit 21 and the logic circuit 13. Thus, by controlling the reference voltage at the output of the digital-analog converter 17, the delay time in the logic circuit 13, which is a delay time circuit for the semiconductor test system, is controlled.

Figure 7:
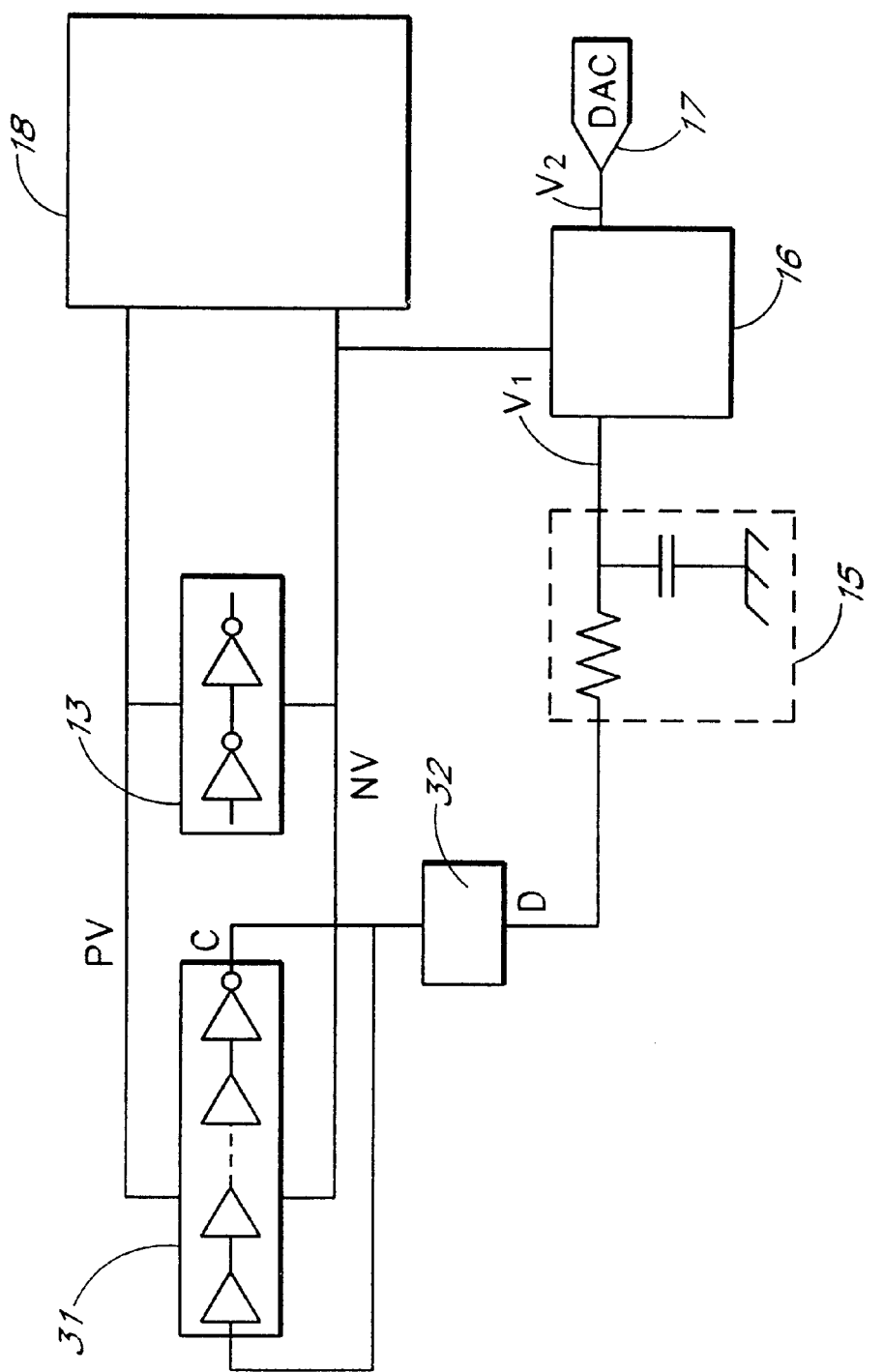
FIG. 7 is a block diagram showing a circuit configuration of the delay time control circuit in the third embodiment of the present invention.

FIG. 7 is a block diagram showing a third embodiment of the present invention. In this example, a ring oscillator having a delay circuit 31 is formed. As in the examples of FIGS. 1 and 6, the delay circuit 31 has a plurality of series connected gates which are the same kind of semiconductor circuit in the logic circuit 13 whose delay times are desired to be controlled. The delay circuit 31 is formed in the same integrated circuit of the logic circuit 13. Further, as in the example of FIGS. 1 and 6, the delay circuit 31 and the logic circuit 13 are provided with the same control voltages, i.e., a negative control voltage NV and a positive control voltage PV.

In this example, the ring oscillator is formed by connecting the output of the last stage gate in the delay circuit 31 to the input of the first stage of gate in the delay circuit 31. The output of the last stage gate in the delay circuit is polarity inverted in this example as shown in FIG. 7. Thus, the closed loop is formed which oscillates once a pulse is supplied thereto. The oscillation frequency of this ring oscillator is determined by the delay time of the delay circuit 31, i.e., a period of the oscillation frequency is equal to two times of the delay time in the delay circuit 31.

The output of the delay circuit 31, shown in FIG. 8A, is also supplied to a pulse generator 32 which functions to convert a delay time to a duty cycle. The pulse generator 32 generates a fixed pulse width every time it receives a signal from the delay circuit 31. An example of such a pulse generator is a monostable (one-shot) multivibrator. If the delay time in the delay circuit 31 varies, the oscillation frequency in the ring oscillator will vary, and as a result, the duty cycle of the output of the pulse generator 32 varies accordingly as shown in FIG. 8B. Namely, the delay time in the delay circuit 31 is converted to the duty cycle in the output of the pulse generator 32.

The output of the pulse generator (delay-duty converter) 32 are integrated (averaged) by the integrator 15 so that a DC voltage V1 at the output of the integrator 15 represents the duty cycle of the output pulses of the pulse generator 32. The integrated voltage V1 is supplied to the delay time control voltage generator 16 wherein it is compared with a reference voltage V2 from the digital-analog converter 17. The delay time control voltage generator 16 produces a negative control voltage NV based on the voltage difference between the integrated voltage V1 and the reference voltage V2. A positive control voltage PV is produced by the threshold voltage control circuit 18. The negative and positive control voltages change the delay times in the delay circuit 31 and the logic circuit 13. Thus, by controlling the reference voltage at the output of the digital-analog converter 17, the delay time in the logic circuit 13, which is a delay time circuit for the semiconductor test system, is controlled.

As in the foregoing, according to the present invention, the delay time control circuit for the semiconductor test system can control the delay time of the CMOS gate delay circuit with high accuracy and stability without involving a large increase of power consumption in the overall delay circuit.

Further, in the present invention, the delay time control circuit can control the delay time of the semiconductor gate delay circuit with high accuracy and stability with a minor increase of circuit components. Furthermore, the delay time control circuit of the present invention can control the delay time of the semiconductor gate delay circuit with high resolution by controlling positive and negative gate control voltages of each semiconductor gate.

What is claimed is:

1. A delay time control circuit for controlling delay times of a logic circuit which determines timings of signals propagating therethrough, comprising:

a delay circuit having a plurality of series connected semiconductor gates, said delay circuit forming a ring oscillator by connecting an output of the last semiconductor gate of said delay circuit to an input of a first semiconductor gate to form a closed loop;

a pulse generator for generating a fixed pulse width signal every time when receiving an oscillation signal from said ring oscillator;

an integrator which integrates an output signal of said pulse generator to produce an average voltage indicating a duty cycle of an output of said pulse generator; and a delay time control voltage generator which compares said average voltage from said integrator and a reference voltage indicating a delay time for said logic circuit and generates a control voltage which is applied to said logic circuit and said delay circuit.

2. A delay time control circuit as defined in claim 1, wherein said reference voltage to said delay time control voltage generator is produced by a digital-analog converter which converts a digital signal indicating said delay time for said logic circuit into a corresponding analog reference voltage.

3. A delay time control circuit as defined in claim 1, wherein said semiconductor gates are the same type of semiconductor gates as in the logic circuit whose delay time is to be controlled, and each of said semiconductor gates in said delay circuit and said logic circuit is an inverter having a control gate which is provided with said control voltage from said delay time control voltage generator to control rise and fall times of the inverter by changing a time constant of said inverter.

4. A delay time control circuit as defined in claim 1, wherein said delay circuit is formed in close proximity to said logic circuit in an integrated circuit.

5. A delay time control circuit as defined in claim 1, wherein said semiconductor gates in said delay circuit and said logic circuit are CMOS gates.

6. A delay time control circuit as defined in claim 1, wherein said integrator is a smoothing circuit formed of a series resistance and a parallel capacitance.

7. A delay time control circuit as defined in claim 1, wherein said delay time control voltage generator comprising:

a first delay time control voltage generator which compares said average voltage from said integrator and the reference voltage indicating the delay time for said logic circuit and generates a first control voltage which is applied to said logic circuit and said delay circuit; and a second delay time control voltage generator which receives said first control voltage from said first delay time control voltage generator and generates a second control voltage which is symmetrical to said first control voltage and is applied to said logic circuit and said delay circuit.

8. A delay time control circuit as defined in claim 7, wherein said first delay time control voltage generator is a differential amplifier having two symmetrical input terminals one of which is provided with said average voltage from said integrator and another is provided with said reference voltage.

9. A delay time control circuit as defined in claim 7, wherein said second delay time control voltage generator comprising:

a reference voltage generator which generates a second reference voltage which is an intermediate voltage of a higher source voltage and a lower source voltage to the said second delay time control voltage generator;

a threshold voltage generator which generates an intermediate voltage of the first control voltage and the second control voltage; and a voltage generator which compares said intermediate voltages from said reference voltage generator and said threshold voltage generator and generates said second control voltage which is proportional to a difference between said intermediate voltages.

10. A delay time control circuit as defined in claim 7, wherein said first control voltage is a negative voltage for said logic circuit and said delay circuit, and said second control voltage is a positive voltage for said logic circuit and said delay circuit.

* * * * *